United States Patent [19]

Fang et al.

[11] Patent Number: 4,692,634
[45] Date of Patent: Sep. 8, 1987

[54] SELECTABLE MULTI-INPUT CMOS DATA REGISTER

[75] Inventors: Sheng Fang, Milpitas; Sam H. Lee, Campbell, both of Calif.

[73] Assignee: Advanced Micro Devices, Inc., Sunnyvale, Calif.

[21] Appl. No.: 856,920

[22] Filed: Apr. 28, 1986

[51] Int. Cl.⁴ ...................... H03K 3/356; G11C 11/40
[52] U.S. Cl. .................................. 307/272.1; 377/79
[58] Field of Search ............. 377/79; 307/279, 272 A, 307/272 R, 530, 304

[56] References Cited

U.S. PATENT DOCUMENTS

| | | | |
|---|---|---|---|
| 3,395,292 | 7/1968 | Bogert | 377/79 |
| 3,821,711 | 8/1974 | Crowle | 377/79 |
| 4,031,415 | 6/1977 | Redwine et al. | 307/279 |
| 4,132,904 | 1/1979 | Harari | 307/279 |

*Primary Examiner*—John S. Heyman
*Attorney, Agent, or Firm*—Patrick T. King; Davis Chin; J. Vincent Tortolano

[57] ABSTRACT

A CMOS data register includes a master stage and a slave stage. The master stage is formed of first transfer gates and first storage devices. The slave stage is formed of second transfer gates, second storage devices and third transfer gates. The transfer gates and storage devices are formed of MOS transistors of one conductivity which decreases layout complexity and reduces the amount of chip area required. The data register is formed of a fewer number of transistor components, thereby reducing the loading on the clock signals.

9 Claims, 2 Drawing Figures

SELECTABLE MULTI-INPUT CMOS DATA REGISTER

BACKGROUND OF THE INVENTION

This invention relates generally to storage devices and more particularly, it relates to a selectable multi-input CMOS data register.

Prior art CMOS data registers typically requires the use of a plurality of inverters and transmission gates connected in series for clocking in and holding data in both a master section and a slave section. The data is refreshed by feedback loops which are activated during a non-active clock cycle. Each inverter and each transmission gate is formed of a P-channel MOS transistor and an N-channel MOS transistor. Due to the differences in conductivity type, either the P-channel transistor or the N-channel transistor must be in a separate well. For instance, the P-channel transistor may be formed in an N-well. As a result, the two transistors which form the inverter or transmission gate must be physically separated. Therefore, the interconnection between the P-channel and N-channel transistor is typically longer than the conventional connection between transistors of like conductivity. Further, the interconnection of the transistors of different conductivity increases the layout complexity and thus utilizes more chip area.

In addition, the design of the prior art CMOS data register suffers from the disadvantage of requiring a high number of transistors circuit components. This tended to cause a rather heavy loading on a clock generator which provides the clock signal. It would therefore be desirable to provide a CMOS data register which is formed mainly of transistors of one conductivity type. Further, it would be expedient to reduce the transistor count so as to minimize the amount of chip area used and thus provide a less heavier load to be driven by a clock generator.

SUMMARY OF THE INVENTION

Accordingly, it is a general object of the present invention to provide an improved CMOS data register which is relatively simple and economical to manufacture and assemble, but yet overcomes the disadvantages of the prior art data registers.

It is an object of the present invention to provide a CMOS data register which requires a smaller amount of chip area.

It is another object of the present invention to provide a CMOS data register which has a reduced transistor count and thus decreases the loading on a clock generator supplying the clock signal.

It is still another object of the present invention to provide a CMOS data register which includes selectable multi-input means formed in a master stage of the register.

It is yet still another object of the present invention to provide a CMOS data register which includes a master stage formed of first transfer gates and first storage devices and a slave stage formed of second transfer gates, second storage devices, and third transfer gates.

In accordance with these aims and objectives, the present invention is concerned with the provision of a CMOS data register which includes a master stage having first transfer gates and first storage devices. The first transfer gates are formed of first and second MOS transistors. The first transistor has its drain connected to a first node, its source connected to a second node and its gate connected to a first clock input terminal for receiving a clock signal. The second transistor has its drain connected to a third node, its source connected to a fourth node and its gate connected to the first clock input terminal. The first storage devices are formed of third, fourth, fifth and sixth MOS transistors. The third transistor has its drain connected to a supply potential, its source connected to a fifth node and its gate connected to the second node. The fourth transistor has its drain connected to a ground potential, its source connected to the fifth node and its gate connected to the fourth node. The fifth transistor has its drain connected to the supply potential, its source connected to a sixth node and its gate connected to the fourth node. The sixth transistor has its drain connected to the ground potential, its source connected to the sixth node and its gate connected to the second node.

The CMOS data register further includes a slave stage consisting of second transfer gates, second storage devices, and third transfer gates. The second transfer gates are formed of seventh and eighth MOS transistors. The seventh transistor has its drain connected to the fifth node, its source connected to a seventh node and its gate connected to a second clock input terminal for receiving a signal complementary to the clock signal. The eighth transistor has its drain connected to the sixth node and its source connected to a eighth node and its gate connected to the second clock input terminal. The second storage devices are formed of ninth, tenth, eleventh and twelveth MOS transistors. The ninth transistor has its drain connected to the supply potential, its source connected to a ninth node and its gate connected to the seventh node. The tenth transistor has its drain connected to the ground potential, its source connected to the ninth node and its gate connected to the eighth node. The eleventh transistor has its drain connected to the supply potential, its source connected to a tenth node and its gate connected to the eighth node. The twelveth transistor has its drain connected to the ground potential, its source connected to the tenth node and its gate connected to the seventh node. The third transfer gates are formed of thirteenth and fourteenth MOS transistors. The thirteenth transistor has its drain connected to the ninth node, its source connected to the seventh node and its gate connected to the first clock input terminal. The fourteenth transistor has its drain connected to the tenth node, its source connected to the eighth node and its gate connected to the first clock input terminal.

BRIEF DESCRIPTION OF THE DRAWINGS

These and other objects and advantages of the present invention will become more fully apparent from the following detailed description when read in conjunction with the accompanying drawings, wherein.

DESCRIPTION OF THE PREFERRED EMBODIMENT

Figure 1:
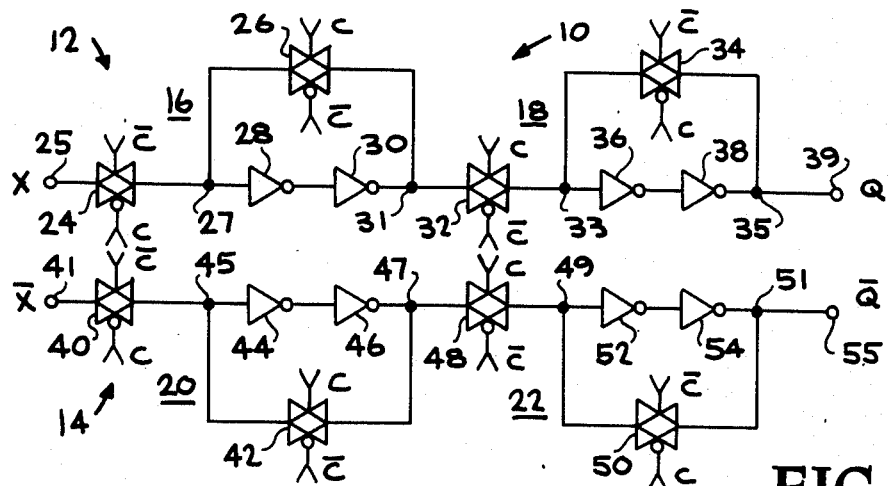
FIG. 1 is a schematic circuit diagram of a CMOS data register of the prior art.

Referring now in detail to the drawings, there is shown in FIG. 1 a schematic circuit diagram of a CMOS (complementary metal-oxide-semiconductor)

data register 10 of the prior art comprised of a true input data section 12 and a false input data section 14. The true input section 12 includes master stage 16 and a slave stage 18. The false input section 14 also includes a master stage 20 and a slave stage 22. The master stage 16 in the true input section 12 consists of a transmission gate 24, a transmission gate 26 and a pair of series-connected inverters 28, 30. The slave stage 18 in the true input section 12 consists of a transmission gate 32, a transmission gate 34 and a pair of series-connected inverters 36, 38. Similarly, the master stage 20 in the false input section 14 consists of a transmission gate 40, a transmission gate 42 and a pair series-connected inverters 44, 46. The slave stage 22 in the false input section 14 consists of a transmission gate 48, a transmission gate 50 and a pair of series-connected inverters 52, 54.

Each of the inverters 28, 30, 36, 38, 44, 46, 52 and 54 is a conventional CMOS inverter formed of a P-channel MOS transistor and an N-channel MOS transistor with each inverter having an input and an output. Each of the transmission gates 24, 26, 32, 34, 40, 42, 48 and 50 is a conventional CMOS transmission gate formed of a P-channel MOS transistor and an N-channel MOS transistor with each gate having a signal input, a signal output, a true clock input and a complementary clock input. The true clock input is connected to the gate electrode of the N-channel transistor and the complementary clock input is connected to the gate electrode of the P-channel transistor. When the true clock input is at a high or logic "1" level and the complementary clock input is at a low or logic "0" level, a signal applied to the signal input will be coupled to the signal output. Thus, the transmission gate is defined to be closed or turned on. When the true clock input is at a low level and the complementary clock input is at a high level, a signal applied to the signal input will not be coupled to the signal output. Thus, the transmission gate is defined to be opened or turned off.

In the true input data section 12, the transmission gate 24 has its signal input connected to an input terminal 25 for receiving a true input signal X, a true clock input for receiving a complementary clock signal $\overline{C}$, a complementary clock input for receiving a true clock signal C, and a signal output connected to a node 27. The true clock signal C is present when C=logic "1" and is not present C=logic "0". The complementary clock signal $\overline{C}$ is present when $\overline{C}$=logic "1" and is not present when $\overline{C}$=logic "0". Therefore, the transmission gate 24 is connected so as to be turned on when the complementary clock signal is present and the true clock signal is not present. Alternately stated, the transmission gate 24 is connected so as to be turned off when the true clock signal is present and the complementary clock signal is not present. When a transmission gate is to be connected so as to be turned on when the true clock signal is present and the complementary clock is not present, then the true clock input receives the true clock signal C and the complementary clock input receive the complementary clock signal $\overline{C}$. The transmission gate 26 is connected so as to be turned on when the true clock signal is present and the complementary clock is not present. The transmission gate 26 has its signal input connected to a node 31 and its signal output connected to the node 27. The inverter 28 has its input connected to the node 27 and its output connected to the input of the inverter 30. The output of the inverter 30 is connected to the node 31 and to the signal input of transmission gate 26.

The transmission gate 32 has its signal input connected to the output of inverter 30 and its signal output connected to a node 33. Further, the transmission gate 32 is connected so as to be turned on when the true clock signal is present and the complementary clock signal is not present. The transmission gate 34 has its signal input connected to a node 35 and its signal output connected the node 33. The transmission gate 34 is connected so as to be turned off when the true clock signal is present and the complementary clock signal is not present. The inverter 36 has its input connected to the node 33 and its output connected to the input of the inverter 38. The output of the inverter 38 is connected to the node 35 and to an output terminal 39 for providing a true output data signal Q.

In the false input data section 14, the transmission gate 40 has its signal input connected to an input terminal 41 for receiving a complementary input signal $\overline{X}$, a true clock input for receiving a complementary clock signal $\overline{C}$, a complementary clock input for receiving a true clock C, and a signal output connected to a node 45. The transmission gate 40 is connected so as to be turned off when the true clock is present and the complementary clock signal is not present. The transmission gate 42 is connected so as to be turned on when the true clock is present and the complementary clock signal is not present. The transmission gate 42 has its signal input connected to a node 47 and its signal output connected to the node 45. The inverter 44 has its input connected to the node 45 and its output connected to the input of the inverter 46. The output of the inverter 46 is connected to the node 47 and to the signal input of the transmission gate 42.

The transmission gate 48 has its signal input connected to the output of the inverter 46 and its signal output connected to a node 49. Further, the transmission gate 48 is connected so as to be turned on when the true clock signal is present and the complementary clock signal is not present. The transmission gate 50 has its signal input connected to a node 51 and its signal output connected to the node 49. The transmission gate 50 is connected so as to be turned off when the true clock signal is present and the complementary clock signal is not present. The inverter 52 has its input connected to the node 49 and its output connected to the input of the inverter 54. The output of the inverter 54 is connected to the node 51 and to an output terminal 55 for providing a false output data signal $\overline{Q}$.

Referring now again to the true input section 12, when the true clock signal C is not present and the complementary signal $\overline{C}$ is present, the transmission gate 24 will be turned on and the transmission gate 26 will be turned off. With the transmission gate 26 being turned off, the output of the inverter 30 is prevented from reaching the node 27. With the transmission gate 24 being turned on, the true input signal X is coupled to the node 27. Thus, the node 27 will be at the same logic state as the input signal X. Further, the node 31 will also be at the same logic state as the input signal X due to the pair of series-connected inverters 28, 30. When the clock signals switch conditions so that the true clock signal C is present and the complementary clock signal $\overline{C}$ is not present, the transmission gate 24 will be turned off and the transmission 26 will be turned on. This serves to isolate the inverters 28, 30 from the input signal X and to connect the output of the inverter 30 to the node 27 so as to reinforce the logic state at the node 27. As a result, the logic state of the true input section 12 can only be changed when the true clock signal C is not present and the complementary clock $\overline{C}$ is present at which time the inverter 30 is decoupled from the node 27.

The operation of the slave stage 18 is identical to that just described with respect to the master stage 16 except the logic state at the node 33 can be changed only when the true clock signal C is present and the complementary clock signal $\overline{C}$ is not present. The inverter 38 reinforces the logic state at the node 33 when the true clock signal C is not present and the complementary clock $\overline{C}$ is present. When the true clock signal C is present and the complementary clock signal $\overline{C}$ is not present, the transmission gate 32 is turned on so that the node 33 will assume the same logic state as the output of the inverter 30. Further, the true data output signal Q at the output terminal 39 will be at the same logic state as the output of the inverter 30 due to the pair of series-connected inverters 36, 38. When the clock signals switch back to the condition where the true clock signal C is not present and the complementary clock $\overline{C}$ is present, the transmission gate 32 is turned off and the transmission gate 34 is turned on. This serves to isolate the node 33 from the output of the inverter 30 and to connect the output of the inverter 38 to the node 33 so that the true data output signal Q remains unchanged. While the slave stage 18 remains unchanged when the true clock signal C is not present and the complementary clock $\overline{C}$ is present, the master stage 16 will change in response to the input signal X. Then, when the true clock signal is present and the complementary clock signal is not present, the true data output signal Q will be changed in its logic state in response to the output of the master stage at the node 31.

The operation of the master stage 20 and the slave stage 22 in the false input section 14 is identical to the corresponding master stage 16 and the slave stage 18 in the true input section. 12. However, it will be noted that the master stage 20 receives the false input signal $\overline{X}$ at the input terminal 41 and the slave stage 22 provides the complementary data output signal $\overline{Q}$ at the output terminal 55.

Figure 2:
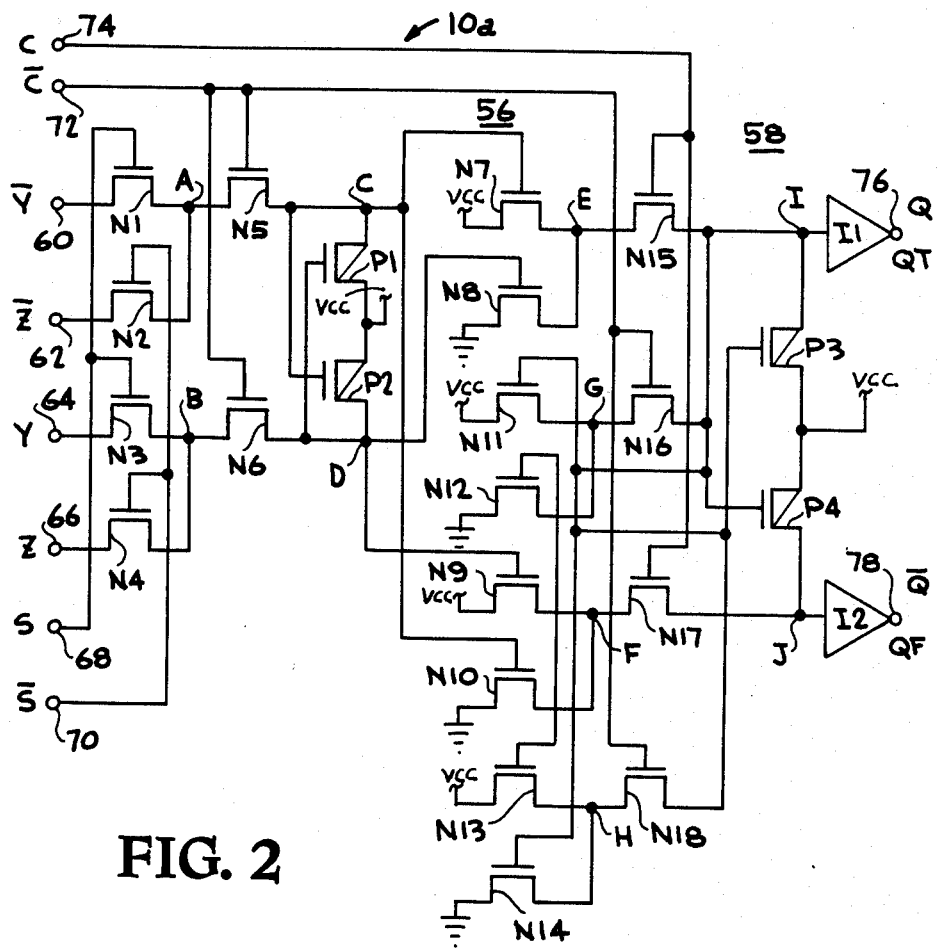
FIG. 2 is a schematic circuit diagram of a CMOS data register according to a preferred embodiment of the present invention.

In FIG. 2, there is shown a schematic circuit diagram of a selectable multi-input CMOS data register 10a according to a preferred embodiment of the present invention. The data register 10a is comprised of a master stage 56 and a slave stage 58. The master stage 56 includes selectable input means formed of N-channel MOS transistors N1 through N4. The transistor N1 has one of its main electrodes such as the drain connected to an input terminal 60 for receiving a first false data input signal $\overline{Y}$. The source of the transistor N1 is connected to the source of the transistor N2 and to a node A. The transistor N2 has its drain connected an input terminal 62 for receiving a second false data input signal $\overline{Z}$. The transistor N3 has its drain connected to an input terminal 64 for receiving a first true data input signal Y. The source of the transistor N3 is connected to the source of the transistor N4 and to a node B. The drain of the transistor N4 is connected to an input terminal 66 for receiving a second true data input signal Z. The gates of the transistors N1 and N3 are connected together and to an input terminal 68 for receiving a true select input signal S. The gates of the transistors N2 and N4 are connected together and to an input terminal 70 for receiving a complementary select input signal $\overline{S}$. For convenience, it should be noted that the P-channel MOS transistors will be identified by the letter P followed by a particular reference number, and the N-channel MOS transistors will be identified by the letter N followed by a particular reference number.

The master stage further includes first transfer gates formed of MOS transistors N5, N6 and first storage devices formed of MOS transistor N7 through N10. The slave stage 58 includes second transfer gates formed of MOS transistors N15, N17; second storage devices formed of MOS transistor N11 through N14; and third transfer gates formed of MOS transistors N16, N18.

In the first transfer gates, the transistor N5 has its drain connected to the node A and its source connected to a node C. The transistor N6 has its drain connected to the node B and its source connected to a node D. The gates of the transistors N5 and N6 are connected together and to a terminal 72 for receiving a complementary clock $\overline{C}$ signal. In the first storage devices, the transistor N7 has its drain connected to a supply voltage or potential and its gate connected to the node C. The transistor N8 has its drain connected to a ground potential and its gate connected to the node D. The sources of the transistors N7 and N8 are connected together and to a node E. The transistor N9 has its drain connected to the supply potential and its gate connected to the node D. The transistor N10 has its drain connected to the ground potential and its gate connected to the node C. The sources of the transistors N9 and N10 are connected together and to a node F. The supply potential VCC is typically +5.0 volts. The nodes A and B define the input of the master stage 56. The nodes E and F define the output of the master stage.

In the second transfer gates of the slave stage 58, the transistor N15 has its drain connected to the node E and its source connected to the node I. The transistor N17 has its drain connected to the node F and its source connected to a node J. The gates of the transistor N15 and N17 are connected together and to a terminal 74 for receiving a true clock signal C. In the second storage devices, the transistor N11 has its drain connected the supply potential and its source connected to a node G. The transistor N12 has its drain connected to the ground potential and its source connected to the node G. The transistor N13 has its drain connected to the supply potential and source connected to a node H. The transistor N14 has its drain connected to the ground potential and its source connected to the node H. The gates of the transistors N11 and N14 are connected together and the node I. The gates of the transistors N12 and N13 are connected together and to the node J. In the third transfer gates, the transistor N16 has its drain connected to the node G and its source connected to the node I. The transistor N18 has its drain connected to the node H and its source connected to the node J. The gates of the transistors N16 and N18 are connected together and to the terminal 72 for receiving the complementary signal $\overline{C}$. The nodes E and F define also input of the slave stage 58. The nodes I and J define the output of the slave stage.

In order to provide a high voltage level near the full supply potential VCC at the nodes C and D when transferring a high logic state from the nodes A and B to the respective nodes C and D, it is necessary to eliminate the threshold voltage drop across the transistors N5 and N6. This is achieved by a pair cross-coupled P-channel MOS transistors P1 and P2 connected between the nodes C and D. The transistor P1 has its source connected to the supply potential VCC and its drain connected to the node C. The gate of the transistor P1 is connected to the source of the transistor N6. The transistor P2 has its source connected also to the supply potential VCC and its drain connected to the node D. The gate of the transistor P2 is connected to the source of the transistor N5.

Similarly, in order to provide a high voltage level near the full supply potential VCC at the nodes I and J when transferring a high logic state from the nodes E and F to the respective nodes I and J, it is necessary to eliminate the threshold voltage drop across the transistors N15 and N17. This is achieved by the provisions of a pair of cross-coupled P-channel MOS transistors P3 and P4 connected between the nodes I and J. The transistor P3 has its drain connected to the supply potential VCC and its drain connected to the node I. The gate of the transistor P3 is connected to the source of the transistor N17. The transistor P4 has its source also connected to the supply potential VCC and its drain connected to the node J. The gate of the transistor P4 is connected to the source of the transistor N15.

If desired, inverters I1 and I2 may be provided. The inverter I1 has its input connected to the node I and output connected to an output terminal 76 which produces the true data output signal Q. The inverter I2 has its input connected to the node J and its output connected to an output terminal 78 which provides the complementary data output signal $\overline{Q}$. The inverters I1 and I2 function as a buffer for the signals at the respective nodes I and J so as to terminate the same with a capacitive load. Further, the inverters permit a higher drive capability. With the inverters being utilized, the node I defines an intermediate complementary data node of the register and provide a complementary data output signal $\overline{Q}$. Likewise, the node J defines an intermediate true data output node of the register and provides a true data output signal Q.

The operation of the circuit of FIG. 2 will now be explained. If the true select S is at a high or logic "1" level, the transistors N1 and N3 will be turned on. This allows the input data signals $\overline{Y}$ and Y applied to the respective terminals 60 and 64 to pass through to the respective nodes A and B. On the other hand, if the complementary select input signal $\overline{S}$ is at a high level, then the transistors N2 and N4 will be turned on. This allows the input data signals $\overline{Z}$ and Z applied to the respective terminals 62 and 64 to pass through to the respective nodes A and B. For the purposes of this discussion, it will be assumed that the true select signal S is the one which is at the high level indicating the selection of input data signals $\overline{Y}$ and Y. Further, it will be assumed that the input data signals have the conditions where $\overline{Y}=0$ and $Y=1$. Accordingly, the node A will be at a low logic level and the node B will be at a high logic level.

For the case where a true clock signal C on the terminal 74 is not present (C=0) and the complementary clock signal CB on the terminal 72 is present ($\overline{C}=1$), the transistor N5 and N6 of the first transfer gates of the master stage 56 are turned on so as to transfer the logic states on the nodes A and B to the nodes C and D, respectively. In this instance, the node C will be at a low logic level and the node D will be at a high logic level. As a result, the transistors N8 and N9 are turned on and the transistors N7 and N10 are turned off. Consequently, the logic state at the node E will be set up to a low logic level and the logic state at the node F will be set up to a high logic level. When the clock signals switch conditions where the true clock signal is present (C=1) and the complementary clock signal is not present ($\overline{C}=0$), the transistor N5 and N6 are turned off so as to isolate the nodes C and D from the respective nodes A and B, thereby latching the nodes C and D. The nodes C and D are referred to as dynamic nodes since they are isolated from all current sources when the register is in the latched condition. In this latch state, the logic state at the nodes C and D are maintained by the capacitive effect of the gates of the transistors N7 through N10. Since these gate capacitors are susceptible to parasitic leakage, they are consider dynamic charge storage elements. However, the charge degradation due to the parasitic effects are not very significant when operating at relatively high clocking rates. At such high speed operations, the register is considered to be virtually static.

Further, when the true clock signal is present and the complementary clock signal is not present the transistors N15 and N17 are turned on so as to transfer the logic states from the input of the slave stage at the nodes E and F to the intermediate output data nodes I and J. Thus, the node I will be at a low logic level and the node J will be at a high logic level. Finally, the output terminal 76 will be at a high logic level (Q=1) and the output node 78 will be at a low logic level ($\overline{Q}=0$). In addition, with the node J being at the high logic level, the transistors N12 and N13 will be turned on so as to set the logic state at the node G to be in the low logic state and to set the logic state at the node H to be in the high logic state for use during the next clock cycle when the true clock signal is not present and the complementary clock signal is present. It will be noted that prior to the next clock cycle, the transistors N16 and N18 are both turned off so as to isolate the nodes I and J from the nodes G and H, respectively. When the next clock cycle occurs, the transistors N16 and N18 are turned on so as to transfer the previously set logic states on the nodes G and H to the nodes I and J, respectively. Thus, the nodes I and J have their logic states reinforced or refreshed during the non-active clock cycle where the true clock signal is not present.

A similiar analysis can be done for the condition of the input data signals where $\overline{Y}=1$ and $Y=0$. Under this condition, the logic state at the output terminal 76 will be at a low logic level and the logic state at the output terminal 78 will be at a high logic level.

The CMOS data register 10a of the present invention is functionally the same as the prior art register 10 of FIG. 1 in terms of providing true and complementary data output signals Q and $\overline{Q}$ in response to the true and complementary clock signals C and $\overline{C}$ and the input data signals Y, $\overline{Y}$ or Z, $\overline{Z}$. The master stage 56 functions analogously to the stages 16 and 20 of FIG. 1 in that the logic states at the nodes E and F are switchable only when the complementary clock signal is present and are latched or remains unchanged when the complementary clock signal is not present. Similarly, the slave stage 58 functions analogously to the stages 18 and 22 of FIG. 1 in that the logic states at the nodes I and J are switchable only when the true clock signal is present and are reinforced or refreshed when the true clock signal is not present.

It should be understood that the register 10 is a traditional CMOS data register of the prior art which is capable of providing simultaneously both true and complementary data output signals Q and $\overline{Q}$ without a gate delay between the two output signals. The register 10a of the present invention functions identically in the same manner as the register 10 in terms of generating true and complementary data output signals without a delay therebetween.

As can be seen by comparing FIGS. 1 and 2, the data register 10a of the present invention requires a substantially fewer number of transistors than the register 10. The transmission gates 24, 26, 40, 42 and the inverters 28, 30, 44, 46 (totalling sixteen transistors) have been replaced by only six transistors, namely transistors N5 through N10. The transmission gates 32, 34, 48 and 50 and the inverters 36, 38, 52, 54 (totalling another sixteen transistors) have been replaced by only eight transistors, namely transistors N11 through N18. Further, it will be noted that a clock signal generator (not shown) which provides the true and complementary clock signals is required to drive sixteen gates in the register 10 as opposed to driving only six gates in the present register 10a. As a result, the loading on the clock signals in the present invention is substantially less than in the prior art register.

Since the register 10a is formed mainly of transistors of one conductivity (N-channel transistors) the interconnection of the transistors is simplified, thereby decreasing the layout complexity and reducing the amount of chip area required. Even if the four P-channel transistors P1 through P4 are included which are used in the preferred embodiment of the present invention, the register 10a would still be advantageous over the prior art register 10.

It should be clearly apparent to those skilled in the art that the source and drain designations for all of the N-channel MOS transistors in the register 10a could be interchanged. In other words, in each instance, the source electrode could be replaced by the drain electrode, and the drain electrode could be replaced by the source electrode.

While there has been illustrated and described what is at present to be considered a preferred embodiment of the present invention, it will be understood by those skilled in the art that various changes and modifications may be made, and equivalents may be substituted for elements thereof within departing from the true scope of the invention. In addition, many modifications may be made to adapt a particular situation or material to the teachings of the invention without departing from the central scope thereof. Therefore, it is intended that this invention not be limited to the particular embodiment disclosed as the best mode for contemplated for carrying out this invention, but that the invention will include all embodiments falling within the scope of the appended claims.

What is claimed is:

1. A CMOS data register comprising:
    a master stage having first transfer gating means and first storage means;
    said first transfer gating means being formed of first and second MOS transistors, said first transistor having its drain connected to a first node for receiving a data input signal, its source connected to a second node and its gate connected to a first clock input terminal for receiving a clock signal, said second transistor having its drain connected to a third node for receiving a signal complementary to the data input signal, its source connected to a fourth node and its gate connected to the first clock input terminal;
    said first storage means being formed of third, fourth, fifth and sixth MOS transistors, said third transistor having its drain connected to a supply potential, its source connected to a fifth node and its gate connected to the second node, said fourth transistor having its drain connected to a ground potenial, its source connected to the fifth node and its gate connected to the fourth node, said fifth transistor having its drain connected to the supply potential, its source connected to a sixth node and its gate connected to the fourth node, said sixth transistor having its drain connected to the ground potential, its source connected to the sixth node and its gate connected to the second node;
    a slave stage having second transfer gating means, second storage means, and third transfer gating means;
    said second transfer gating means being formed of seventh and eighth MOS transistors, said seventh transistor having its drain connected to the fifth node, its source connected to a seventh node and its gate connected to a second clock input terminal for receiving a signal complementary to the clock signal, said eighth transistor having its drain connected to the sixth node, its source connected to an eighth node and its gate connected to the second clock input terminal;
    said second storage means being formed of ninth, tenth, eleventh and twelfth MOS transistors, said ninth transistor having its drain connected to the supply potential, its source connected to a ninth node and its gate connected to the seventh node, said tenth transistor having its drain connected to the ground potential, its source connected to the ninth node and its gate connected to the eighth node, said eleventh transistor having it drain connected to the supply potential, its source connected to a tenth node and its gate connected to the eighth node, said twelfth transistor having its drain connected to the ground potential, its source connected to the tenth node and its gate connected to the seventh node; and
    said third transfer gating means being formed of thirteenth and fourteenth MOS transistors, said thirteenth transistor having its drain connected to the ninth node, its source connected to the seventh node and its gate connected to the first clock input terminal, said fourteenth transistor having its drain connected to the tenth node, its source connected to the eighth node and its gate connected to the first clock input terminal.

2. A data register as claimed in claim 1, further comprising selectable input means responsive to a selection signal for selecting between first true/complementary data input signals and second true/complementary data input signals to be applied to the first and third nodes.

3. A data register as claimed in claim 2, wherein said selection input means comprises fifteenth, sixteenth, seventeenth and eighteenth MOS transistors, said fifteenth transistor having its drain connected to an input terminal for receiving the first complementary data input signal, its source connected to the first node and its gate connected to an input terminal for receiving the selection signal, said sixteenth transistor having its drain connected to an input terminal for receiving the second complementary data input signal, its source connected to the first node and its gate connected to a terminal for receiving a signal complementary to the selection signal, said seventeenth transistor having its drain connected to an input terminal for receiving the first true data input signal, its source connected to the third node and its gate connected to the input terminal for receiving the selection signal, said eighteenth transistor having its drain connected to an input terminal for receiving the second true data input signal, its source connected to the third node and its gate connected to the input terminal for receiving the signal complementary to the selection signal.

4. A data register as claimed in claim 3, further comprising first pull-up means for maintaining the logic states at the second and fourth nodes near the supply potential without a threshold voltage drop during transferring of a high logic state from the first and third nodes to the second and fourth nodes, respectively.

5. A data register as claimed in claim 4, wherein said first pull-up means comprises a pair of cross-coupled P-channel MOS transistors.

6. A data register as claimed in claim 5, further comprising second pull-up means for maintaining the logic states at the seventh and eighth nodes near the supply potential without a threshold voltage drop during transferring of a high logic state from the fifth and sixth nodes to the seventh and eighth nodes, respectively.

7. A data register as claimed in claim 6, wherein said second pull-up means comprises a pair of cross-coupled P-channel MOS transistors.

8. A data register as claimed in claim 7, further comprising a first inverter having its input coupled to the seventh node and its output coupled to an output terminal for providing a true data output signal.

9. A data register as claimed in claim 8, further comprising a second inverter having its input coupled to the eighth node and its output connected to an output terminal for providing a complementary data output signal.

* * * * *